United States Patent [19]

Cooks

[11] Patent Number: 5,207,251

[45] Date of Patent: May 4, 1993

[54] LIQUID LEVEL SENSING METHOD AND APPARATUS

[75] Inventor: Richard Cooks, San Jose, Calif.

[73] Assignee: Dipiero, Inc., Santa Clara, Calif.

[21] Appl. No.: 622,763

[22] Filed: Dec. 5, 1990

[51] Int. Cl.$^5$ .............................................. B65B 3/10
[52] U.S. Cl. ................................... 41/83; 141/39;
141/95; 141/9; 141/104; 141/198; 137/454;
73/299
[58] Field of Search ...................... 141/1, 4, 5, 9, 83,
141/39, 40, 51, 94, 95, 104, 105, 198, 192;
137/453, 454; 73/299

[56] References Cited

U.S. PATENT DOCUMENTS

| | | | |
|---|---|---|---|
| 3,864,928 | 2/1975 | Eigenbrod | 141/5 X |
| 4,020,690 | 5/1977 | Samuels et al. | 73/299 |
| 4,072,934 | 2/1978 | Hiller et al. | 141/95 X |
| 4,598,742 | 7/1986 | Taylor | 141/95 |
| 4,630,478 | 12/1986 | Johnson | 73/299 |
| 4,805,672 | 2/1989 | Berrettini | 141/5 |
| 4,893,498 | 1/1990 | Jensen | 73/49.2 |

Primary Examiner—Ernest G. Cusick
Attorney, Agent, or Firm—Rosenblum, Parish & Isaacs

[57] ABSTRACT

An automated liquid holding tank and method for automatically filling a liquid holding tank. The tank comprises a holding tank with dispensers for filling the tank with liquids and a pressure sensor attached to the tank for measuring the liquid level within the tank. The pressure sensor also provides a tank liquid level indicator output signal which is sent to a controller that compares the output signal with a pre-set value. When the output signal matches the pre-set value the controller closes the dispensers. The pressure sensor includes a gas bubble within a connecting tube to communicate the tank liquid pressure to the pressure sensor.

2 Claims, 2 Drawing Sheets

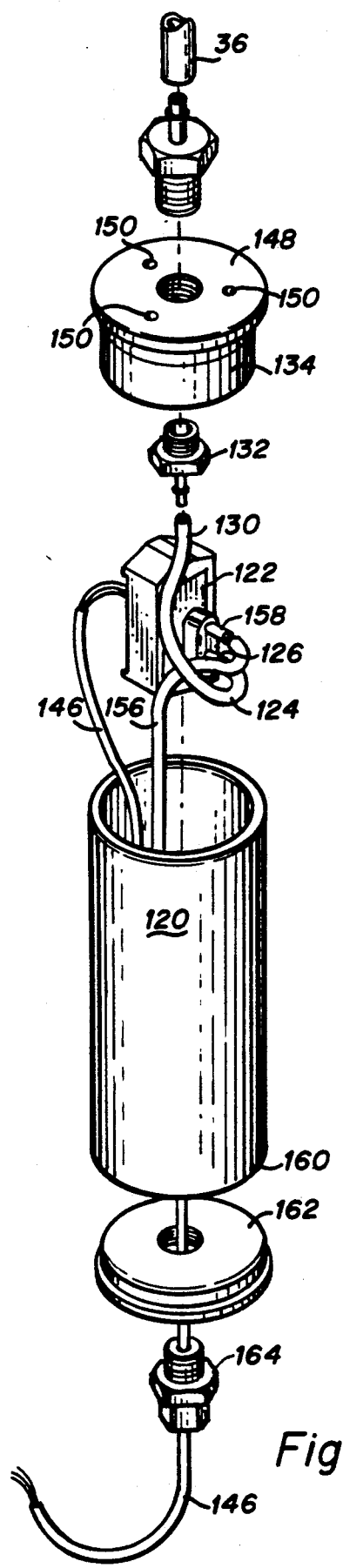
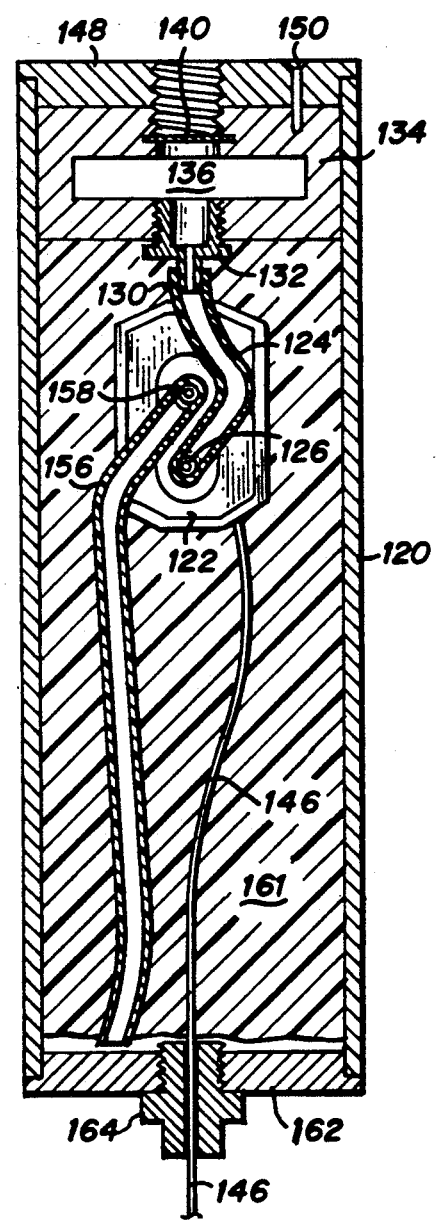
Fig_3
Fig_4

LIQUID LEVEL SENSING METHOD AND APPARATUS

BACKGROUND OF THE INVENTION

1. Field of the Invention

The present invention is generally related to hydrostatic pressure liquid level sensors, and more particularly to a method and device for the automated measurement of the levels of liquids dispensed into processing tanks, such as those utilized in the manufacture of semiconductor wafers.

2. Brief Description of the Prior Art

The processing of semiconductor wafers typically involves several steps in which the wafers are immersed in various corrosive liquid baths to etch material from the surface of the wafers. The baths in which the etching process occurs are typically small tanks which hold two to five gallons of etchant liquid. Such etching processes have become automated to improve quality control and increase throughput. The automated etching processing equipment requires liquid level sensors to control the quantity of various liquids that are automatically dispensed into the tank, such that the proper concentrations of the etchant liquids are automatically established.

A variety of liquid level sensors have been utilized to sense the liquid level in a tank and control the flow of liquids into the tank. One such device utilizes a hollow tube that is inserted downwardly through the surface of the liquid into the tank. A pressure sensor is engaged to the outward end of the tube to detect changes in the air pressure within the tube as a measure of differing liquid levels within the tank which change the air pressure within the tube. A disadvantage of such devices is that they involve a physical intrusion into the tank which can obstruct the automated equipment, and with etchant liquid components such as hydrogen peroxide, additional air bubbles may enter the tube and cause erroneous readings. Other liquid level sensors, such as floats, are also intrusive into the work area and therefore are disadvantageous.

Another type of liquid level detector utilizes a hollow L-shaped tube which projects from the bottom of the tank outwardly and upwardly. The liquid level in the upwardly projecting portion of the hollow tube mirrors the liquid level in the tank and thus is an indication of the level in the tank. A plurality of optical detectors are positioned at particular level locations along the length of the upwardly projecting portion of the tube, such that the passage of the liquid level within the tube through such an optical detector is an indication of the liquid level within the tank. This type of level detector becomes inaccurate when liquids having significantly different specific gravities are sequentially input into the tank. For instance, if the tank is initially partially filled with a low specific gravity liquid such as water, and then a high specific gravity liquid such as concentrated sulfuric acid is added, the high specific gravity liquid will flow to the bottom of the tank and into the inlet of the exterior tube. The denser liquid will then cause erroneous readings within the measurement tube. Also, the manual adjustment of each optical detector is required in order to utilize the tank for a different task.

Other liquid level measurement devices include ultrasonic detectors which operate on significantly different principles from the present invention.

SUMMARY OF THE INVENTION

It is therefore an object of the present invention to provide a liquid level sensor which does not intrude into the work area of the tank that is being measured;

It is another object of the present invention to provide a liquid level sensor which utilizes a pressure transducer to provide a measurement that is indicative of the liquid level within the tank;

It is a further object of the present invention to provide a liquid level sensor which measures the hydrostatic pressure proximate the bottom of the tank as a measure of the liquid level within the tank;

It is yet another object of the present invention to provide a method for measuring the liquid level within a tank which is thermally isolated from the tank, such that high temperature liquids within the tank do not affect the measurement of liquid level;

The liquid level sensor of the present invention includes a pressure transducer that is disposed in hydraulic communication with a pressure sensitive diaphragm. A hollow tube, having a gas bubble disposed in a portion thereof, is connected between the pressure sensitive diaphragm and the bottom portion of the liquid holding tank. Liquid from the bottom of the tank flows into a portion of the hollow tube to apply pressure to the gas within the tube, and thereby to the pressure sensitive diaphragm.

Electrical signals from the transducer provide a measure of the pressure against the pressure sensitive diaphragm that is caused by the liquid level within the tank. The electrical signals are fed to a computerized controller which converts the electrical signals into a reading indicative of the liquid level within the tank. The controller may be programmed to turn on or off various valves that sequentially control the addition of various liquids into the tank, such that the proper concentrations of liquids which comprise a particular etchant bath may be automatically achieved. In a preferred embodiment, the controller may be programmed with the dimensions of a tank and the specific gravities of various etchant liquids and additives, such that the process of filling, emptying and refilling a tank may be entirely automated.

It is therefore an advantage of the present invention that it provides a liquid level sensor which does not intrude into the work area of the tank that is being measured;

It is another advantage of the present invention that it provides a liquid level sensor which utilizes a pressure transducer to provide a measurement that is indicative of the liquid level within the tank;

It is a further advantage of the present invention that it provides a liquid level sensor which measures the hydrostatic pressure proximate the bottom of the tank as a measure of the liquid level within the tank;

It is yet another advantage of the present invention that it provides a method for measuring the liquid level within a tank which is thermally isolated from the tank, such that high temperature liquids within the tank do not affect the measurement of liquid level;

The foregoing and other objects, features and advantages of the present invention will be apparent from the following description of the preferred embodiments which make reference to the several figures of the drawings.

IN THE DRAWING

FIG. 3 is an exploded perspective view of the liquid level sensor of the present invention;

FIG. 4 is a side cross-sectional view of the liquid level sensor depicted in FIG. 3.

DETAILED DESCRIPTION OF THE PREFERRED EMBODIMENTS

The present invention utilizes a pressure sensitive device that is connected proximate the bottom of a liquid holding tank to measure the hydrostatic pressure proximate the bottom of the tank as a measure of the liquid level within the tank. A computerized controller receives and analyzes electrical signals from the pressure sensitive device to actuate valves that control the flow of various liquids into the tank, such that the levels and concentrations of the liquids within the tank are automatically established.

Figure 1:
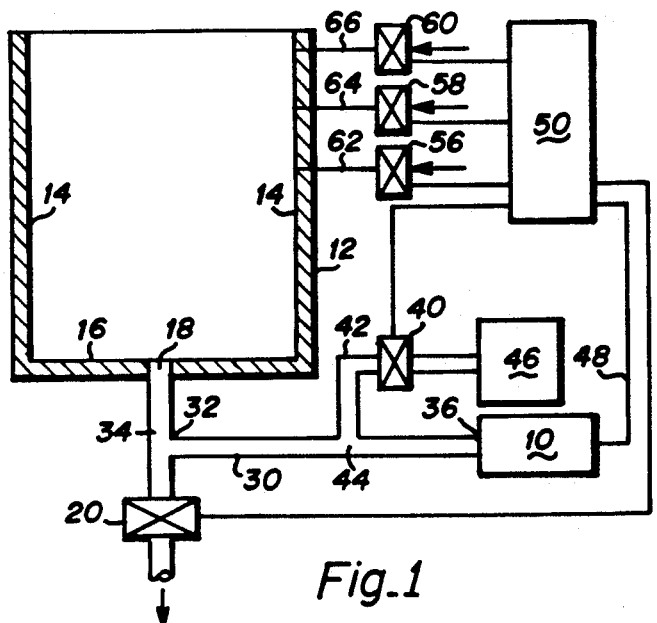
FIG. 1 depicts the liquid level sensor of the present invention installed with a liquid holding tank.

FIG. 1 depicts the installation of a hydrostatic pressure detector 10 to a liquid holding tank 12, in accordance with the present invention. As depicted therein, the tank 12 is formed with side walls 14 and a bottom wall 16. A drain tube 18 having a drain valve 20 disposed therewithin is engaged to the bottom wall 16 of the tank 12. A hollow pressure detector lead tube 30 is engaged at a first end 32 to the drain tube 18 at a point 34 between the bottom wall 16 and the drain valve 20. The tube 30 is engaged in hydraulic communication with the drain tube 18, such that liquid within the drain tube 18 may enter the end 32 of the hollow detector tube 30. A pressure detector 10 is engaged to the distal end 36 of the detector tube 30, such that any increase or decrease in liquid pressure at the end 32 of the detector tube 30 will be communicated to the pressure sensor 10 engaged at the distal end 36 of the tube 30. It is within the contemplation of the invention to alternatively engage the end 32 of the tube 30 directly through the bottom wall 16 or lower portion of a side wall 14 of the tank 12.

In the preferred embodiment, a gas bubble is maintained throughout most of the length of the tube 30. The gas bubble, which is preferably nitrogen gas, is created by the activation of a purge valve 40 which is connected by a purge tube 42 to the detector tube 30 at a location 44 proximate the distal end 36 of the tube 30. The purge valve 40 is connected to a pressurized nitrogen gas source 46. Thus, when the tank 12 is periodically drained through the opening of valve 20, the purge valve 40 is opened to blow nitrogen through the detector tube 30 to force any liquid within the tube 30 out through the tube end 32 into the drain tube 18. When the tank 12 is filled, the remaining nitrogen in the tube 30 forms the gas bubble within the tube 30.

It is therefore to be generally understood that as the tank 12 is filled with liquid (with the drain valve 20 closed) that the drain tube 18 and a portion of the detector tube 30 proximate the end 32 will fill with liquid also. The pressure within the detector tube 30 will increase as the liquid level in the tank 12 increases. The pressure within the tube 30 is communicated to the pressure sensor 10 which provides control means, an electrical output signals 48 that is indicative of the pressure within the tube 30, and therefore indicative of the height of the liquid level within the tank.

The preferred embodiment is automated utilizing a computerized controller 50. The controller 50 receives the electrical output signals 48 from the pressure sensor 10 and is programmed to interpret the electrical signals 48 as indicating liquid levels within the tank 12. When the controller 50 detects that a particular liquid level has been reached it is further programmed to open or close liquid dispensing valves, such as valves 56, 58 and 60 which control the dispensing of liquids into the tank 12 through lines 62, 64 and 66 respectively.

Figure 2:
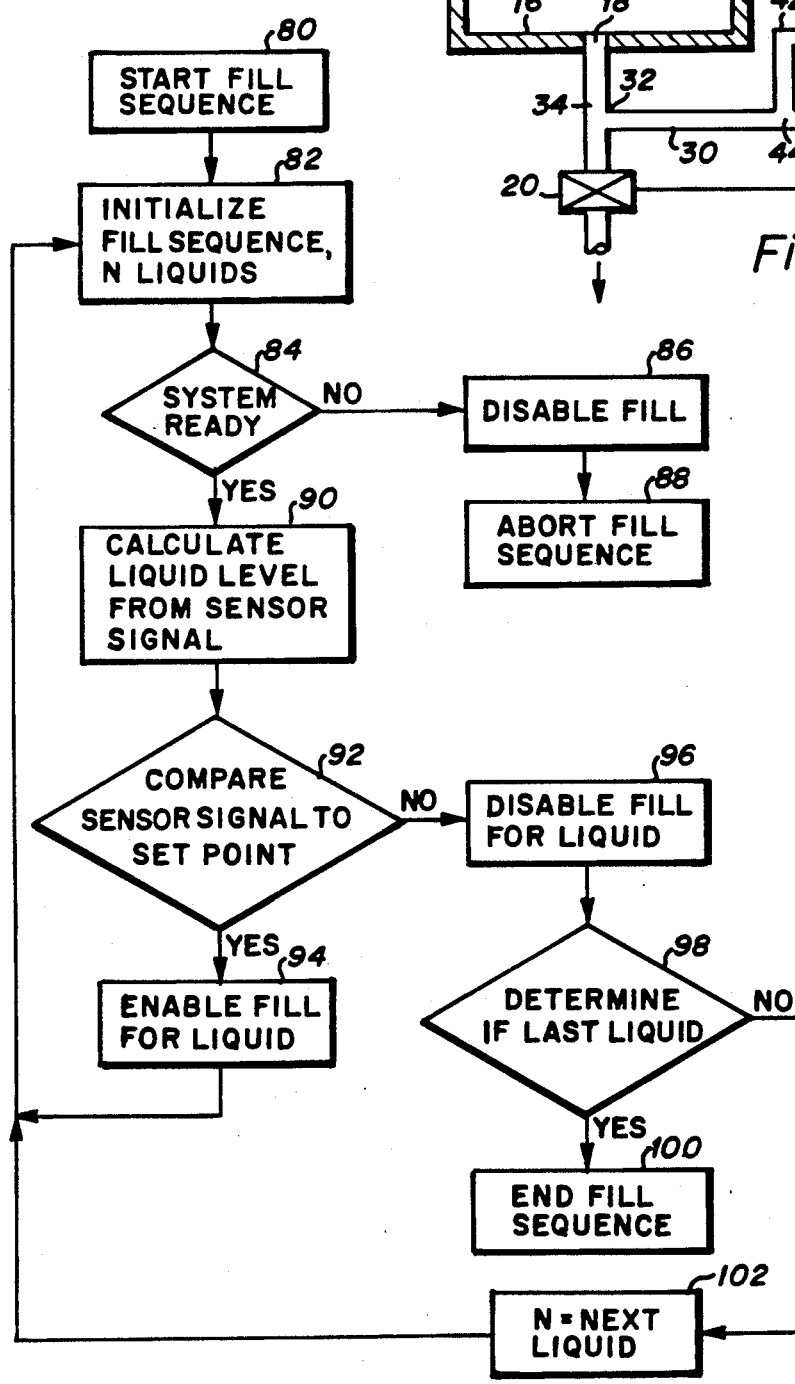
FIG. 2 is a schematic diagram representing the process for measuring and controlling liquid levels of the present invention.

A schematic diagram representing the controller logic which controls applicant's process for measuring and controlling liquid levels in a tank is depicted in FIG. 2. A fill sequence 80 for N different chemicals is commenced by initializing the controller 82 to the first chemical $N_1$. Following initialization 82, it is determined whether the system is ready for safe chemical fill 84. If it is determined that the system is not ready, a disable signal 86 is generated and the fill sequence is aborted 88 and the drain valve 20 is activated. If it is determined that the system is ready for filling, the valve associated with the first chemical $N_1$, such as valve 56, is activated and the signals 48 of the control means are utilized to calculate the liquid level in the tank on an ongoing basis as the tank is filled 90. For each liquid level calculation 90, a comparison 92 is made to determine whether the liquid level 90 is less than the predetermined set point for chemical $N_1$. If the liquid level comparison 92 determines that the liquid level 90 is less than the set point, then the system is enabled 94 to continue the filling process with liquid $N_1$. The liquid level calculation 90 and comparison 92 continue as the tank is filled with liquid $N_1$. At the time that it is determined by comparison 92 that the liquid level 90 is greater than the set point for chemical $N_1$, the system is disarmed 96 for chemical $N_1$ by closing the valve, such as valve 56, associated with the fill line for chemical $N_1$. A determination 98 is then made whether the liquid $N_1$ is the last liquid in the chemical fill sequence. If it is the last liquid then the fill sequence is ended 100. If it is not the last liquid then the chemical fill process is recommenced 102 for liquid $N_2$. The system then continues the above described process for liquid $N_2$ until it reaches its set point fill level for liquid $N_2$, whereupon the fill sequence is ended or reinitiated for a third chemical $N_3$. Finally, when all liquids have been added to their set points, the fill sequence is ended and the tank is ready for use.

As an example of applicant's method for the automated liquid level sensing and filling of a tank, it can be assumed that line 62 dispenses water ($N_1$), line 64 dispenses hydrogen peroxide ($N_2$) and line 66 dispenses sulfuric acid ($N_3$). It is further assumed that a desired concentration by volume of liquids in the filled tank is 60% water, 20% hydrogen peroxide and 20% sulfuric acid. Assuming that the tank has been drained and the detector tube 30 purged, the tank is first manually filled with water to 60% of its volume by the manual operation of valve 56. The pressure sensor 10 provides an electrical signal 48 to the controller that is indicative of the liquid level within the tank when the tank is 60% full of water. This electrical signal value for pressure ($P_1$), corresponding to the set point for liquid $N_1$, is placed in memory storage in the controller 50. Thereafter, the hydrogen peroxide valve 58 is opened such that hydrogen peroxide is dispensed into the tank 12 through line 64 until the tank is 80% filled. At this point the pressure sensor 10 delivers an electrical signal value 48 to the controller 50 that is indicative of the pressure ($P_2$) when the correct quantity of hydrogen peroxide has been added to the tank. Finally, the sulfuric acid valve 60 is manually opened such that sulfuric acid is dispensed into the tank 12 through line 66 until the tank is 100% full. At this time the pressure sensor 10 provides an electrical signal 48 to the controller 50 which is indicative of the pressure ($P_3$) after the proper quantity of sulfuric acid has been added to the tank. At this point, the tank is fully and properly filled and the computerized controller 50 has stored in memory the three readings associated with the proper fill levels $P_1$, $P_2$, and $P_3$ for the water, hydrogen peroxide and sulfuric acid respectively. The tank is then utilized for its designated industrial purpose in its normal operations.

After standard usage, the chemicals in the tank are sufficiently weakened and/or contaminated that the tank must be drained and refilled. In the preferred embodiment, the controller 50 is programmed and connected to automatically control the drain valve 20, to open it, whereby the tank is fully drained. When the pressure sensor signal 48 to the controller reads zero, the controller automatically activates the purge valve 40 to purge the detector tube 30. Thereafter, the controller automatically closes the drain valve 20 and purge valve 40 and opens the water input valve 56 to commence inletting water into the tank 12. When the signal 48 from the pressure sensor 10 equals the stored value for $P_1$, the water valve 56 is closed and the hydrogen peroxide valve 58 is opened by the controller. Thereafter, when the signal 48 from the pressure sensor 10 reaches the stored value for $P_2$, the hydrogen peroxide valve 58 is automatically closed and the sulfuric acid valve 60 is automatically opened. Finally, when the signal 48 from the pressure sensor 10 reaches the stored value for $P_3$, the sulfuric acid valve 60 is automatically closed. The tank has therefore been automatically drained and refilled and is now in condition for further use.

In the preferred embodiment, the sensor output signal 48 is a 0 to 10 volts DC analog signal which is fed to the controller 50. The signal is filtered and averaged in the controller to obtain an accurate level reading where liquid sloshing activity may be occurring. The signal analysis routine of the controller averages the analog signals 48 at approximately every eight output signals 48 to provide a stable average signal. Each average signal is compared to the stored process variable, and when the signal value matches the stored variable a debounce time value is decremented before a level achieved flag bit is activated. If the process signal falls below the stored value before the debounce time has expired, the flag bit will be denied. If the process variable falls below the stored value after the flag bit has been turned on, an additional debounce time value will decrement before turning off the flag bit.

In the preferred embodiment, while the tank is being filled, the analog signal 48 is monitored for its rate of change. If the signal 48 does not meet a specified rate of change criteria, the filling of the tank will be aborted. In the preferred embodiment a signal rate of change of approximately 500 millivolts per minute is utilized. As is known in the art, it may be necessary to monitor other process liquid levels for process assurance. Such other levels that are monitored can include such things as the heater interlock level (if a heater is utilized), a recirculation pump level and an overfill level. The controller is programmed with such levels, and it responds to such levels by turning off critical process equipment and providing an operator alarm.

The sensor 10 may also be connected to a Low Liquid Interlock Package for use with heated tanks. This interlocks the heater contactor directly using a stand-alone A/D heater controller with relay outputs. In the preferred embodiment, the heater controller used is an OMRON E5CS-X temperature controller, which accepts a J-Type thermocouple input, 0 to 50 millivolts DC. The 0 to 10 volts DC analog signal from sensor 10 is processed using a voltage divider resistor network to convert the 0 to 10 volts DC signal to 0 to 10 millivolts DC. The heater controller is set so that it will turn off the heater if the signal from the sensor 10 indicates that the chemical level in the tank 12 has become too low.

In an augmented preferred embodiment of the present invention the controller may be programmed to receive the dimensions of the tank 12, together with the specific gravities of liquids that might be utilized to fill such tanks. Thereafter, utilizing well known concepts, the computer calculates the fill levels of each chemical required in the tank to achieve a designated final concentration of various liquids in the tank. Specifically, utilizing the specific gravities of the various designated liquid components, the pressure levels (such as $P_1$, $P_2$ and $P_3$ identified in the example given above), are calculated, and the expected electrical signals 48 corresponding to those pressure levels is automatically stored in the controller memory as the liquid level set point values. This alternative preferred embodiment is therefore a fully automated tank filling method, requiring identification of the specific chemicals, the concentration of the chemicals desired and the tank dimensions to automatically fill the tank.

FIGS. 3 and 4 depict the preferred embodiment of the pressure sensor 10 of the present invention. The sensor 10 includes a cylindrical tubular housing 120 having a commercially available pressure transducer 122 disposed therewithin. In the preferred embodiment a commercially available pressure transducer manufactured by Microswitch, Inc., part number 162PC01D which is rated for 27 inches of water is utilized. A hollow pressure transmitting tube 124 is connected to the pressure input 126 of the transducer 122. In the preferred embodiment the tube 124 is composed of Tygon having an outer diameter of 0.25 inches and an inner diameter of 0.125 inches. The other end 130 of the tube 124 is connected to a fitting 132 which is threadably engaged in a mating threaded orifice of a commercially available gauge guard 134. In the preferred embodiment, the gauge guard is manufactured by Fluoroplastics, Inc., Boston, Mass. and is identified as a W/TFE one-half inch NPT part number GPO-148. As is best seen in FIG. 3, the gauge guard 134 includes a generally cylindrical housing having an internal hollow reservoir which is hydraulically connected to the input end of connector 132, a pressure sensitive diaphragm 140 and a pressure input orifice 142. In the preferred embodiment the tube 124, connector 132 and reservoir 136 are all filled with a 10 weight silicone oil which is used to transmit pressure induced movements of the diaphragm 140, through the pressure input 126, and into the pressure transducer 122. The pressure transducer 122 converts the inputted pressure signals into electrical signals 48 which are outputted on an electrical cable 146. The gauge guard 134 is engaged to a bottom plate 148 utilizing three screws 150 and the bottom plate is welded to the lower opening 152 of the housing 120. In the preferred embodiment the diaphragm 140 is preloaded by the withdrawal of silicone oil from the pressure transmission mechanism to approximately 2.PSI below ambient, whereby the accuracy of the device is improved. A ventilation tube 156 is engaged to the ventilation orifice 158 of the transducer 122 and drawn back upwards within the housing 120. The housing 120 is then potted with polyurethane rubber resin 161, and after curing, the ventilation tube 156 is cut off approximately flush with the hardened resin 161 at the top end 160 of the housing 120. The electrical cable 146 is fed through a top plate 162 which is then welded to the top end 160 of the housing 120, such that the components within the housing are sealed. A threaded connector 164 serves to finish the protrusion of the connector 146 through the top plate 162.

The pressure sensor 10 and other components of the present invention must operate in a hostile environment that includes hot corrosive liquids. Thus, all components that may come in contact with the fluids, or fumes from the fluids, are composed of chemical resistant plastics such as PFA and PTFE teflon. PFA and PTFE are plastic materials manufactured by the Dupont Corporation, Wilmington, Del.; Teflon is a trademark of the Dupont Corporation. Additionally, the utilization of a detector tube 30 that is disposed between the pressure sensor and the liquid in the tank 12, permits the pressure sensor to be remotely located relative to the tank 12. This feature is particularly important where hot liquids are being utilized. In the preferred embodiment, the nominal length of the detector tube 30 is increased by at least 1 centimeter for each degree centigrade above 40 degrees centigrade of the temperature of the liquid in the tank.

While the invention has been particularly shown and described with reference to certain preferred embodiments, it will be understood by those skilled in the art that various alterations and modifications in form and in detail may be made therein. Accordingly, it is intended that the following claims cover all such alterations and modifications as may fall within the true spirit and scope of the invention.

What I claim is:

1. An automated liquid holding tank, comprising:
   a tank for holding liquids;
   fill means for dispensing one or more liquids into said tank;
   liquid level measurement means being engaged to said tank and functioning to provide an output signal indicative of the level of liquid within said tank, said liquid level measurement means comprising a pressure sensitive device that is engaged proximate a bottom surface of said tank to measure the hydrostatic pressure of the liquid within said tank as a measure of the liquid level within said tank, said pressure sensitive detector being engaged to said tank utilizing a length of hollow tubing, and wherein a gas bubble is disposed within portions of said hollow tubing proximate said pressure detector;
   controller means operative to initiate and terminate said dispensing of said one or more liquid components into said tank, said controller means having a memory storage and a comparison means, said memory storage being adapted for storing a liquid level set point value for each said liquid dispensed into said tank, said comparison means being provided to compare said output signal to said liquid level set point values;
   control means being engaged to said fill means and functioning to control said fill means in response to a signal from said controller means;
   said controller means providing a signal to said control means when said output signal is approximately equal to a liquid level set point value stored in said memory storage.

2. An automated liquid tank as described in claim 1 wherein said fill means is adapted for dispensing a plurality of liquids into said tank;
   a plurality of liquid level set point values are stored in said memory storage, each said liquid level set point value corresponding to a desired quantity of liquid within said tank;
   said control means functioning to control the dispensing of each said liquid into said tank.

* * * * *